United States Patent
Tiron et al.

(10) Patent No.: US 10,928,725 B2
(45) Date of Patent: Feb. 23, 2021

(54) METHOD FOR THE DIRECTED SELF-ASSEMBLY OF A BLOCK COPOLYMER BY GRAPHOEPITAXY

(71) Applicant: COMMISSARIAT A L'ENERGIE ATOMIQUE ET AUX ENERGIES ALTERNATIVES, Paris (FR)

(72) Inventors: Raluca Tiron, Saint-Martin-le-Vinoux (FR); Nicolas Posseme, Sassenage (FR); Xavier Chevalier, Grenoble (FR); Christophe Navarro, Bayonne (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/304,897

(22) PCT Filed: May 23, 2017

(86) PCT No.: PCT/EP2017/062456
§ 371 (c)(1),
(2) Date: Nov. 27, 2018

(87) PCT Pub. No.: WO2017/202861
PCT Pub. Date: Nov. 30, 2017

(65) Prior Publication Data
US 2019/0278170 A1    Sep. 12, 2019

(30) Foreign Application Priority Data
May 27, 2016 (FR) ...................................... 1654793

(51) Int. Cl.
*H01L 21/3213* (2006.01)
*H01L 21/311* (2006.01)
(Continued)

(52) U.S. Cl.
CPC ........ *G03F 7/0002* (2013.01); *B81C 1/00031* (2013.01); *H01L 21/0271* (2013.01);
(Continued)

(58) Field of Classification Search
None
See application file for complete search history.

(56) References Cited

U.S. PATENT DOCUMENTS 4,379,001 A    4/1983  Sakai et al.
8,853,085 B1   10/2014 Abdallah et al.
(Continued)

FOREIGN PATENT DOCUMENTS

EP    2 276 690 A2    1/2011
FR    2 975 823 A1    11/2012
(Continued)

OTHER PUBLICATIONS

Chevalier, X., et al., "Study and optimization of the parameters governing the block copolymer self-assembly: toward a future integration in lithographic process," Proc. SPIE 7970, Alternative Lithographic Technologies III, 79700Q, Apr. 2011, 11 pages.
(Continued)

*Primary Examiner* — Stephanie P Duclair
(74) *Attorney, Agent, or Firm* — Pillsbury Winthrop Shaw Pittman LLP (57) ABSTRACT

A method for the directed self-assembly of a block copolymer by graphoepitaxy, includes forming a guide pattern, the guide pattern having a cavity with a bottom and side walls; forming a functionalisation layer on the guide pattern that has a first portion and a second portion disposed, respectively, on the bottom and side walls of the cavity; forming a protective layer on the first and second portions of the functionalisation layer; etching the protective layer and the second portion of the functionalisation layer such that a
(Continued)

portion of the protective layer is retained and the side walls of the cavity are exposed, the retained portion of the protective layer having a thickness of less than 15 nm; selectively etching the portion of the protective layer relative to the first portion of the functionalisation layer and to the guide pattern; and depositing a block copolymer in the cavity.

11 Claims, 4 Drawing Sheets

(51) Int. Cl.
*H01L 21/033* (2006.01)
*H01L 21/027* (2006.01)
*G03F 7/00* (2006.01)
*B81C 1/00* (2006.01)

(52) U.S. Cl.
CPC .... *H01L 21/0337* (2013.01); *H01L 21/31111* (2013.01); *H01L 21/31116* (2013.01); *H01L 21/31122* (2013.01); *H01L 21/31138* (2013.01); *H01L 21/31144* (2013.01); *H01L 21/32134* (2013.01); *H01L 21/0334* (2013.01)

(56) References Cited

U.S. PATENT DOCUMENTS

| | | | | |
|---|---|---|---|---|
| 2011/0147984 | A1* | 6/2011 | Cheng | B82Y 10/00 264/220 |
| 2014/0256145 | A1 | 9/2014 | Abdallah et al. | |
| 2015/0076108 | A1* | 3/2015 | Chang | G03F 7/40 216/49 |
| 2015/0249112 | A1 | 9/2015 | Takeguchi et al. | |
| 2015/0301445 | A1* | 10/2015 | Komatsu | C09D 125/14 216/49 |
| 2016/0077264 | A1* | 3/2016 | Kang | G03F 7/0002 430/321 |

FOREIGN PATENT DOCUMENTS

| | | |
|---|---|---|
| FR | 3 000 600 A1 | 7/2014 |
| FR | 3 000 601 A1 | 7/2014 |
| FR | 3 025 937 A1 | 3/2016 |
| FR | 3 037 715 A1 | 12/2016 |
| FR | 3 041 471 A1 | 3/2017 |
| WO | WO 2009/134635 A2 | 11/2009 |
| WO | WO 2014/102222 A1 | 7/2014 |

OTHER PUBLICATIONS

Choi, J. W., et al., "A facile route for fabricating graphene nanoribbon array transistors using graphoepitaxy of a symmetric block copolymer," Optomechatronic Micro/Nano Devices and Components III, Oct. 2007, Proc. of SPIE, vol. 9428, Mar. 2015, XP060051918, pp. 94280T-1-94280T-10.

International Search Report as issued in International Patent Application No. PCT/EP2017/062456, dated Aug. 24, 2017.

Tiron, R., et al., "Template affinity role in CH shrink by DSA planarization," Optomechatronic Micro/Nano Devices and Components III, Oct. 2007, Proc. of SPIE, vol. 9423, Mar. 2015, XP060051606, pp. 942317-1-942317-11.

Cheng, J., et al., "Customization and Design of Directed Self-Assembly Using Hybrid Prepatterns," Optomechatronic Micro/Nano Devices and Components III, Oct. 2007, Proc. of SPIE, vol. 9423, Mar. 2015, XP060051623, pp. 942307-1-942307-8.

Liu, C.-C., et al., "Fin formation using Graphoepitaxy DSA for FinFET device fabrication," Optomechatronic Micro/Nano Devices and Components III, Oct. 2007, Proc. of SPIE, vol. 9423, Mar. 2015, XP060051595, pp. 94230S-1-94230S-10.

* cited by examiner

METHOD FOR THE DIRECTED SELF-ASSEMBLY OF A BLOCK COPOLYMER BY GRAPHOEPITAXY

TECHNICAL FIELD

The present invention relates to a method for the directed self-assembly (DSA) of a block copolymer by graphoepitaxy, using a functionalised guide pattern.

PRIOR ART

The need for methods making it possible to produce objects having ever smaller dimensions is constantly increasing, and this is so on account of the trend towards miniaturisation of electronic components.

Among the most promising alternative lithography techniques may be cited lithography techniques using self-assembly of block copolymers.

A block copolymer is a polymer composed of several blocks of monomers, for example two blocks of monomers A and B, of different chemical natures, bound together by a covalent bond. When sufficient mobility is given to the chains, for example by heating, the chain A and the chain B have a tendency to phase separate and reorganise to form perfectly organised structures, such as for example a two-dimensional network comprising spheres of A in a matrix of B, or cylinders of A in a matrix of B, or instead intercalated lamella of A and lamella of B.

Block copolymers thus have the property of forming patterns that may be controlled thanks to the ratio of monomers. Moreover, the periodicity of the patterns formed by the block copolymers is directly linked to the molar mass of the block copolymers, such that by controlling this molar mass it is possible to control the resolution of the patterns that they form.

These properties of block copolymers are used within the scope of graphoepitaxy methods. Graphoepitaxy methods generally consist in producing guide patterns on the surface of a substrate, these guide patterns defining cavities within which the block copolymers are going to be deposited to form secondary patterns of better resolution.

However, it is difficult to control the orientation of the secondary patterns with respect to the guide patterns.

Indeed, the orientation of the secondary patterns with respect to the guide patterns depends on the interactions of the monomer blocks of the block copolymer with the surfaces of the guide pattern, with those of the substrate and with air.

If the guide has the same preferential affinity with one of the two phases of the block copolymer at the bottom and on the walls of the guiding cavity, then this phase is going to self-organise at the interface with the guide. Thus the domain that has to be removed preferentially during the revelation step will not traverse the full height of the guide pattern and a residual layer of the other phase of the polymer is going to form at the interface with the substrate. This will be a limitation for the transfer by etching of the block copolymers thereafter.

The most advantageous case is to generate guide patterns having a neutral cavity bottom (equivalent interaction of the two blocks with the substrate) and with the edges of the cavity preferentially affined with one of the two phases of the polymer. In this case the domain of the sacrificial polymer that is going to be removed selectively during the revelation step traverses the entire thickness up to the interface with the substrate, which is very advantageous for the step of transferring the patterns in the substrate by etching (ref. R. Tiron et al, SPIE 2015).

Furthermore, in the case of an A-b-B type block copolymer the control of the interaction energies with the surface may take place for example by grafting A-r-B type random copolymers of judiciously chosen composition (ref. X. Chevalier et al, SPIE 2011).

Methods of the prior art have proposed controlling these interactions by grafting a random polymer to the bottom of the cavity whereas the walls of the cavity remain bare. To do this, the random polymer is diluted then it is deposited by spin coating. During the grafting annealing, a low thickness of the random polymer then fixes itself onto the bottom of the cavity whereas the walls of the cavity remain bare. However, when on the same silicon substrate there are guide patterns with variable densities, even if the method functions for a given pattern, this technique does not work for guides with a higher density because the layer of random polymer is also deposited on the walls of the cavity.

DESCRIPTION OF THE INVENTION

The invention aims to overcome the drawbacks of the prior art by proposing a method making it possible to form a guide pattern for graphoepitaxy wherein the bottom and the walls of the cavities of the guide pattern are functionalised differently, whatever the density of the guide pattern.

To do this, according to the invention, a method is proposed for the directed self-assembly of a block copolymer by graphoepitaxy, the method comprising the following steps:
  forming a guide pattern on a substrate, the guide pattern comprising a cavity comprising a bottom and side walls;
  forming on the guide pattern a first functionalisation layer made of a first material having a first chemical affinity with respect to the block copolymer, the first functionalisation layer comprising a first portion arranged on the bottom of the cavity and a second portion arranged on the side walls of the cavity;
  forming a protective layer on the first and second portions of the first functionalisation layer;
  etching the protective layer and the second portion of the first functionalisation layer, so as to conserve a portion of the protective layer and to expose the side walls of the cavity, said portion of the protective layer being arranged on the bottom of the cavity and having a thickness below 15 nm;
  etching said portion of the protective layer selectively with respect to the first portion of the first functionalisation layer and to the guide pattern; and
  depositing a block copolymer in the cavity.

The method thus makes it possible to form a guide pattern comprising at least one cavity of which the bottom is functionalised differently from the side walls. The method is efficient whatever the density of the cavities in the guide pattern.

The method is particularly advantageous because the first portion of the protective layer makes it possible to protect the first portion of the first functionalisation layer from the later steps of the method and particularly aggressive steps which could alter the quality thereof (for example plasma etching steps). The method according to the first aspect of the invention may also have one or more of the characteristics below taken individually or according to all technically possible combinations thereof.

According to one embodiment, the method further comprises, after the etching of said portion of the protective layer, a step of forming a second functionalisation layer on the side walls of the cavity, the second functionalisation layer being formed of a second material having a second chemical affinity with respect to the block copolymer and a molar mass greater than that of the first material.

According to another embodiment, the etching of the protective layer and the second portion of the first functionalisation layer is carried out in two successive sub-steps:
  etching the protective layer so as to expose the second portion of the first functionalisation layer and to form said portion of the protective layer;
  etching the second portion of the first functionalisation layer selectively with respect to said portion of the protective layer and to the guide pattern.

According to a development of the latter embodiment, the method further comprises, before the etching of said portion of the protective layer, the following steps:
  forming a second functionalisation layer made of a second material having a second chemical affinity with respect to the block copolymer, the second functionalisation layer comprising a first portion arranged on said portion of the protective layer (3) and a second portion arranged on the side walls of the cavity; and
  etching the first portion of the second functionalisation layer selectively with respect to the second portion of the second functionalisation layer and to said portion of the protective layer.

The first portion of the protective layer makes it possible, whatever the nature of the first and second functionalisation layers, not to graft the second functionalisation layer instead of the first functionalisation layer during the formation of the second functionalisation layer, by avoiding that the two functionalisation layers are in contact.

According to one embodiment, the protective layer may be deposited so as to comprise a first portion deposited on the first portion of the first functionalisation layer and a second portion deposited on the second portion of the first functionalisation layer.

In this case, the first portion of the protective layer may be thicker than its second portion, which makes it possible to be able to conserve a part of the thickness of the first portion of the protective layer even when the second portion of the protective layer is etched by an isotropic etching technique. Alternatively, it could be envisaged to produce a protective layer of constant thickness, but to etch uniquely the second portion of the protective layer by an anisotropic etching technique.

A protective layer of variable thickness may be obtained by a non-conformal deposition technique.

According to another embodiment, the protective layer may be deposited so as to fill completely the cavity. In this case, the thickness of the protective layer is reduced until only a portion at the bottom of the cavity, of thickness below 15 nm, is conserved. Advantageously, the protective layer is deposited by evaporation, which makes it possible to deposit it at ambient temperature. The protective layer may also be deposited by vapour phase sputtering.

According to different embodiments:
  the protective layer may be etched by a wet etching technique using a solution of hydrofluoric acid or phosphoric acid; or then
  the protective layer may be etched by an isotropic plasma etching technique.

Advantageously, the second portion of the first functionalisation layer is etched by an isotropic plasma etching technique. Indeed, since the first portion of the first functionalisation layer is protected by the portion of the protective layer located at the bottom of the cavity, it is possible to etch in a selective manner the second portion of the first functionalisation layer uniquely using an isotropic plasma etching technique. The isotropic plasma etching used may be an oxidising or reducing plasma etching.

Advantageously, the first portion of the second functionalisation layer is etched by an anisotropic plasma etching technique, which makes it possible to conserve the second portion of this functionalisation layer, even if it is not protected.

Advantageously, the first portion of the protective layer is etched by wet etching using a solution of hydrofluoric acid or phosphoric acid. It is thus possible to etch uniquely the protective layer whereas the guide pattern and the functionalisation layers are not etched.

Advantageously, the block copolymer comprises at least two monomer blocks, the first functionalisation layer having an equivalent affinity with all the monomer blocks.

Advantageously, the second functionalisation layer has a preferential affinity with one of the monomer blocks.

It is thus possible to produce secondary patterns by means of the block copolymer which have an orientation perpendicular to the substrate.

BRIEF DESCRIPTION OF THE FIGURES

Other characteristics and advantages of the invention will become clear from reading the detailed description that follows, with reference to appended FIGS. 1a to 1h, which illustrate the different steps of a method according to one embodiment of the invention.

For greater clarity, identical or similar elements are marked by identical reference signs in all of the figures.

DETAILED DESCRIPTION OF AT LEAST ONE EMBODIMENT

FIGS. 1a to 1h represent the steps of a method for manufacturing a guide pattern for graphoepitaxy according to one embodiment of the invention.

Figure 1A:
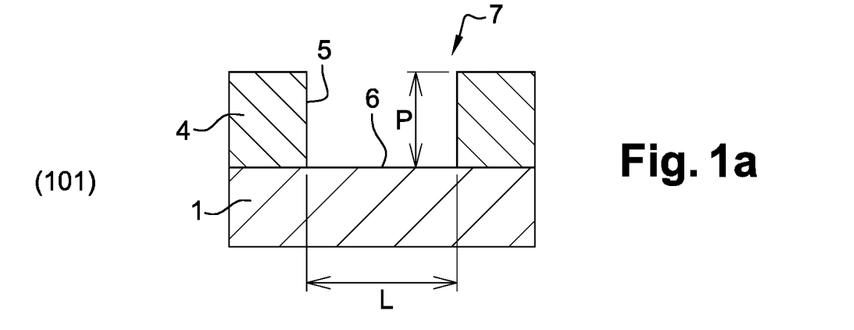
Figure 1B:
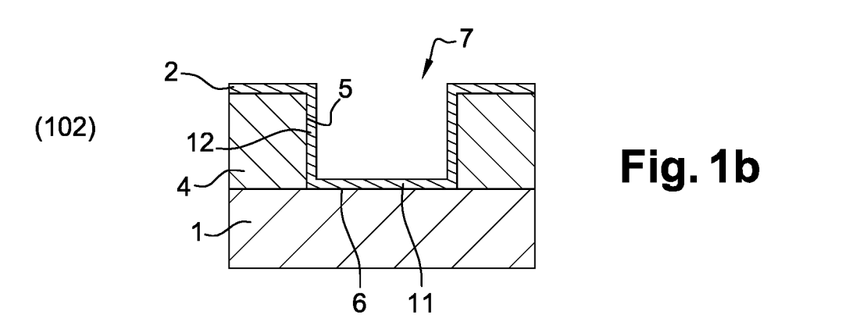
Figure 1C:
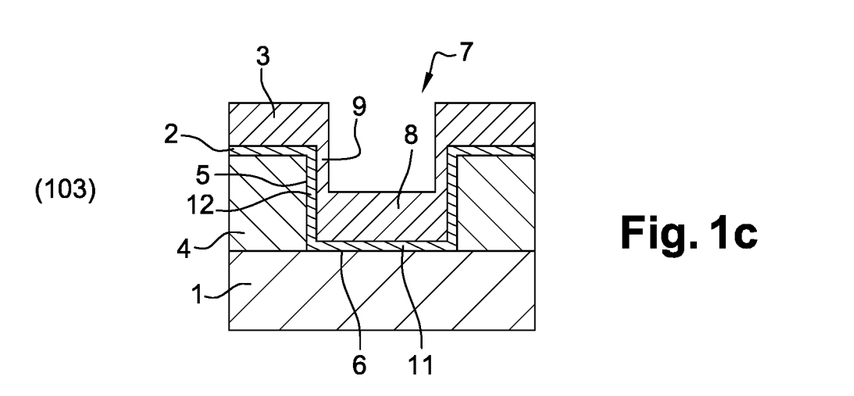
Figure 1D:
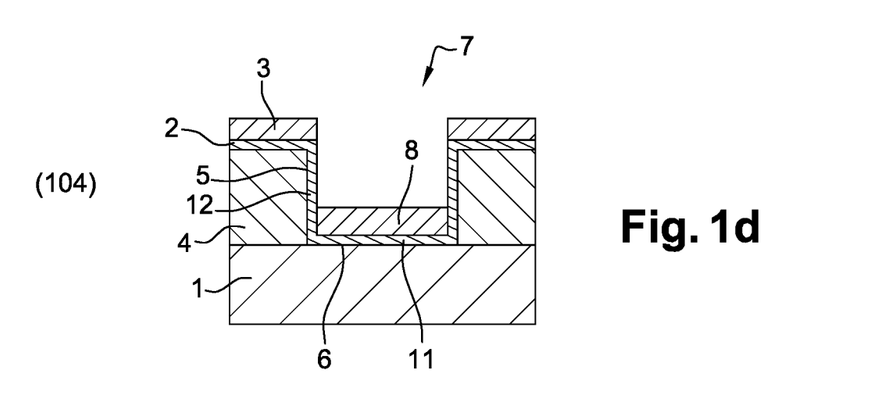
Figure 1E:
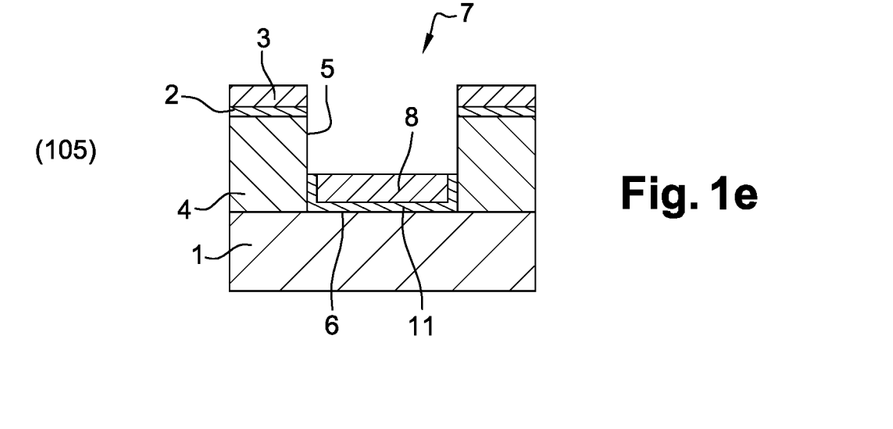
Figure 1F:
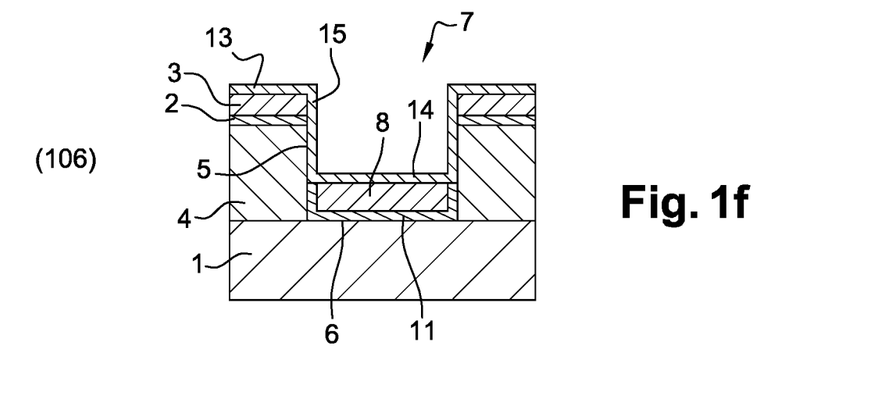
Figure 1G:
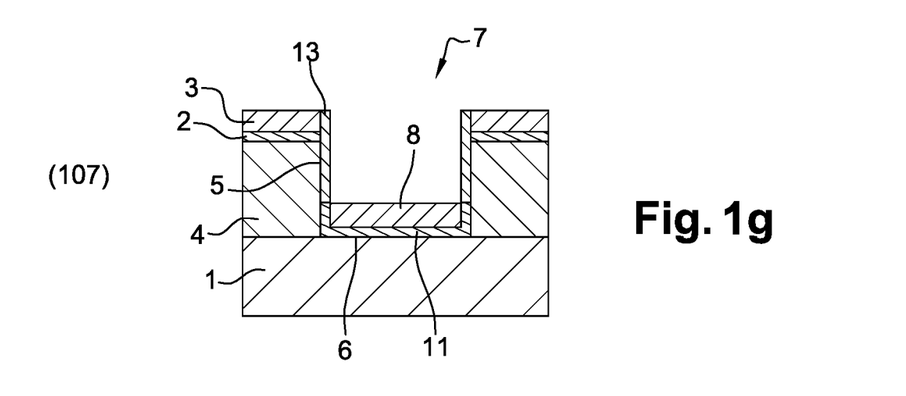
Figure 1H:
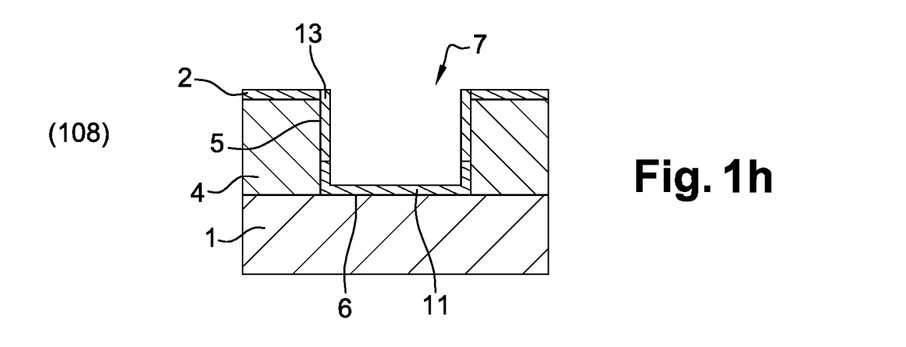

With reference to FIG. 1h, this method makes it possible to obtain a guide pattern 4 for graphoepitaxy comprising at least one cavity 7 of which the bottom 6 is functionalised so as to have a first affinity with the block copolymer that will be deposited in this cavity, whereas the side walls 5 are functionalised so as to have a second affinity with the copolymer that will be deposited in the cavity.

To do this, with reference to FIG. 1a, the method comprises a first step 101 of forming a guide pattern 4 on a substrate 1. The guide pattern 4 comprises at least one cavity 7. The cavity 7 comprises a bottom 6 and side walls 5 extending along a direction secant to the surface of the substrate. More specifically, the side walls 5 preferably extend along a direction perpendicular to the surface of the substrate. The cavity 7 may have different geometries. It may thus take the shape of a cylindrical well, a trench, a well of rectangular section, etc. The guide pattern 4 is preferably made of a material resistant to the etching techniques used during the later steps of the method, for example a material inert to hydrofluoric acid (HF) and/or to phosphoric acid ($H_3PO_4$). To this end, according to a first embodiment, the guide pattern may comprise carbon. Thus, the guide pattern may be made of carbon deposited by centrifugation (also called SOC for spin-on-carbon) or made of any other anti-reflective carbon layer. According to a second embodiment, which may be combined or not with the first, the guide pattern may be covered with a layer resistant to hydrofluoric acid (HF) and/or to phosphoric acid ($H_3PO_4$). This second embodiment makes it possible to make the guide pattern of any type of material, such as for example silicon oxide, then to protect it by depositing above a layer resistant to the etching techniques used during the later steps of the method. Each cavity 7 preferably has a depth P comprised between 50 and 300 nm. Each cavity 7 preferably has a width L comprised between 30 and 200 nm. The step 103 of forming the guide pattern 4 may comprise the following sub-steps:

depositing one or more layers on the substrate;

producing at least one cavity 7 through this or these layers, preferably by lithography, for example by photolithography.

With reference to FIG. 1b, the method next comprises a step 102 of forming a first functionalisation layer 2 on the guide pattern 4. The first functionalisation layer 2 comprises a first so-called "horizontal" portion 11 deposited on the bottom 6 of the cavity and a second so-called "vertical" portion 12 deposited on the side walls 5 of the cavity. The first functionalisation layer 2 has a substantially constant thickness. The first functionalisation layer 2 has a thickness preferably comprised between 2 and 15 nm, and in a more preferential manner between 5 and 12 nm. The first functionalisation layer 2 is a layer of a first polymer. The composition of this first polymer is chosen as a function of the affinity that it is wished to obtain between the bottom 6 of the cavity 7 and the monomer blocks of the block copolymer that will be deposited in this cavity. According to different embodiments, the first polymer may be a random copolymer, a homopolymer or any other type of graftable polymer being able to be used to control surface energies, such as for example a self-assembled monolayer (SAM). The first polymer could also be a crosslinkable polymer. According to a preferential embodiment, the first polymer may be chosen in such a way that the attraction forces between each of the monomer blocks of the block copolymer and the first functionalisation layer are equivalent. In this case, when the block copolymer that will be deposited in the cavity is PS-b-PMMA, the first functionalisation layer could be a layer of PS-r-PMMA, comprising 70% by mass of polystyrene (PS) and 30% by mass of polymethyl methacrylate (PMMA). According to another embodiment, when the block copolymer that will be deposited in the cavity is PS-b-PMMA of lamellar morphology, the first functionalisation layer could be a layer of PS-r-PMMA, comprising 50% by mass of polystyrene (PS) and 50% by mass of polymethyl methacrylate (PMMA).

The step 102 of forming the first functionalisation layer 2 preferably comprises a sub-step of depositing a layer of the first polymer, for example by spin coating, on the guide pattern 4. The spin coating may be carried out by diluting the first polymer in an organic solvent. When the first polymer is PS-r-PMMA, the organic solvent may be propylene glycol methyl ether acetate (PGMEA). During this sub-step, the layer of the first polymer preferably completely covers the guide pattern. The concentration of the initial solution and the speed of deposition will be chosen as a consequence. Thus, when the cavity has a depth of 150 nm, the solution of the first polymer diluted in the organic solvent may have a mass concentration of first polymer substantially equal to 5%. The step 102 of forming the first functionalisation layer 2 may next comprise a sub-step of fixing, also called grafting, the layer of the first polymer on the guide pattern 4. This grafting may be carried out by thermal annealing or photo-crosslinking. The thermal annealing is preferably carried out at a temperature substantially equal to 250° C., typically between 230° C. and 260° C., for a duration substantially equal to 10 minutes, typically between 5 and 15 minutes. The thermal annealing may be carried out on a hot plate or in a furnace. The step 102 of forming the first functionalisation layer 2 may next comprise a sub-step of rinsing during which the surplus of the first polymer is removed using a solvent. When the first polymer is PS-r-PMMA, the solvent used may be propylene glycol methyl ether acetate (PGMEA).

The method next comprises a step of depositing a protective layer 3 in the cavity.

According to one embodiment, not represented, this protective layer 3 may be deposited so as to completely fill the cavity 7.

According to another embodiment, represented in FIG. 1c, the protective layer 3 may be deposited so as to comprise a first so-called "horizontal" portion 8 deposited on the horizontal portion 11 of the first functionalisation layer and a second so-called "vertical" portion 9 deposited on the vertical portion 12 of the first functionalisation layer 2.

According to one embodiment, the protective layer 3 may be a dielectric inorganic layer comprising silicon which may be deposited at a temperature below 300° C., and preferably at a temperature below 250° C. in order not to damage the first functionalisation layer during its deposition. Thus, the protective layer may be a layer of one of the following materials: SiN, SiOC, $SiO_2$, SiCBN. The protective layer 3 could also be a layer of a silicon filled polymer, such as for example a silicon containing anti-reflective coating (SiARC), a layer of HSQ (ultra-dense hydrogen silsesquioxane) or instead a layer of poly(dimethylsiloxane) (also called PDMS). According to another embodiment, the protective layer may also be a layer of $HFO_2$ or TiN.

When the protective layer comprises a horizontal portion 8 and a vertical portion 9, the horizontal portion 8 of the protective layer preferably has a thickness comprised between 5 and 15 nm, and even more preferentially between 10 and 15 nm. The vertical portion 9 of the protective layer 3 advantageously has a thickness below the thickness of the horizontal portion of the protective layer in order to be able to etch by an isotropic etching technique the vertical portion of the protective layer 3 while conserving at least a part of the horizontal portion of the protective layer.

To do this, the protective layer 3 is deposited by a non-conformal deposition technique. This non-conformal deposition technique may be vapour phase sputtering or deposition by evaporation.

With reference to FIG. 1d, the method next comprises a step 104 of etching the protective layer 3 so as to only conserve a horizontal portion 8 of the protective layer deposited at the bottom of the cavity. At the end of this step, the horizontal portion 8 of the protective layer 3 has a thickness below 15 nm.

The etching is preferably an isotropic etching. This etching step does not attack the first functionalisation layer, or the guide pattern, or the substrate. When the protective layer has been deposited so as to comprise a horizontal portion and a vertical portion, this etching step makes it possible to remove the vertical portion 9 of the protective layer 3 and it also makes it possible to reduce the thickness of the horizontal portion 8 of the protective layer 3. When the protective layer has been deposited so as to completely fill the cavity, this etching step makes it possible to reduce the thickness of the protective layer until only a horizontal portion of thickness below 15 nm is conserved at the bottom of the cavity.

Different etching techniques may be used.

Thus, according to a first embodiment, the protective layer 3 may be etched by a wet etching technique. When the protective layer 3 is a layer of SiOC, $SiO_2$, SiCBN, $HFO_2$, the wet etching may be carried out using an etching solution comprising hydrofluoric acid.

When the protective layer 3 is a SiN layer, the wet etching may be carried out using a hydrofluoric acid-based or phosphoric acid-based etching solution.

When the protective layer is a TiN layer, the exposed portion of the protective layer may be etched by an alkaline solution (SC1).

The duration of exposure of the protective layer to the etching solution depends on the composition of the protective layer and the thickness to be etched. For example, the speed of attack of a SiN layer by a solution of hydrofluoric acid diluted to 1% by mass is 5 angstroms per minute. The speed of attack of a SiN layer by a solution of phosphoric acid diluted to 1% by mass is 40 angstroms per minute. The speed of attack of a $SiO_2$ layer by a solution of hydrofluoric acid diluted to 1% by mass is 50 angstroms per minute.

According to a second embodiment, the protective layer 3 may be etched by a plasma etching technique. A plasma comprising a $C_xH_yF_z$ type gas is preferably used to this end. The etching may be carried out in a capacitively coupled or inductively coupled, preferably inductively coupled, plasma etching reactor.

Thus, as an example, the etching may be carried out by injecting into the reactor:
a flux of 200 $cm^3$/minute of $CH_3F$ gas;
a flux of 200 $cm^3$/minute of dioxygen gas;
a flux of 120 $cm^3$/minute of helium gas;
a flux of 5 $cm^3$/minute of $SiCl_4$ gas.

The etching may be carried out at a pressure comprised between 50 and 80 milliTorr, a temperature of 60° C., a power of 400 W, and a bias voltage of 250V.

Furthermore, it also possible to pulse the bias voltage or the power of the source in order to make the etching more isotropic. The pulsed parameter is preferably pulsed at a frequency of 500 Hz according to a 50% operating cycle.

With reference to FIG. 1e, the method next comprises a step of selective etching of the vertical portion 12 of the first functionalisation layer 2. The etching of the vertical portion 12 of the first functionalisation layer 2 is isotropic. The etching of the vertical portion 12 of the first functionalisation layer 2 does not attack the protective layer 3, or the guide pattern, or the substrate. During this step, only the vertical portion 12 of the first functionalisation layer, which is apparent, is etched. To do this, the vertical portion 12 of the first functionalisation layer 2 may be etched by an oxidising or reducing plasma etching technique. This etching may be carried out in a capacitively or inductively coupled plasma etching reactor.

As an example, when the first functionalisation layer is a carbon layer of 10 nm thickness, it could be etched by injecting into the plasma reactor:
a flux of 200 $cm^3$/minute of $SO_2$ gas;
a flux of 30 $cm^3$/minute of dioxygen gas;
a flux of 50 $cm^3$/minute of helium gas.

The etching may be carried out at a pressure of 10 milliTorr, a temperature of 60° C., a power of 900 W, and a bias voltage of 200V.

With reference to FIG. 1f, the method may next comprise a step 106 of forming a second functionalisation layer 13 in the cavity 7. The second functionalisation layer 13 comprises a first so-called "horizontal" portion 14 deposited on the horizontal portion 8 of the protective layer 3 and a second so-called "vertical" portion 15 deposited on the side walls 5 of the cavity. The second functionalisation layer 13 has a substantially constant thickness. The second functionalisation layer 13 has a thickness preferably comprised between 2 and 15 nm, and in a more preferential manner between 5 and 12 nm. The second functionalisation layer 13 is a layer of a second polymer, different from the first polymer. The composition of this second polymer is chosen as a function of the desired interactions between the side walls of the cavity 7 and the block copolymer that will be deposited in this cavity. According to different embodiments, the second polymer may be a random copolymer, a homopolymer or any other type of graftable polymer being able to be used to control surface energies, such as for example a self-assembled monolayer (SAM). According to a preferential embodiment, the second polymer may be chosen so as to have a preferential interaction with one of the phases A or B of the block copolymer. To this end, the second polymer could be a homopolymer of one of the phases of the block copolymer that will be deposited in the cavity. For example, when the block copolymer is PS-b-PMMA, the second functionalisation layer could for example be a layer of a PS homopolymer or a PMMA homopolymer.

The step 106 of forming the second functionalisation layer 13 preferably comprises a sub-step of depositing a layer of the second polymer, for example by spin coating. The spin coating may be carried out by diluting the second polymer in an organic solvent. This organic solvent is preferably propylene glycol methyl ether acetate (PGMEA). This first sub-step of depositing is carried out in such a way that the thickness of the second polymer deposited is sufficiently important to completely cover the guide pattern. The solution concentration of the second polymer and the speed of deposition will thus be chosen as a function of the height of the guide pattern 4, in such a way that at the end of the step of depositing the second polymer, the layer of the second polymer completely covers the guide pattern 4.

For example, when the cavity 7 has a depth P of 150 nm, it is possible to use a solution of the second polymer having a mass concentration of the second polymer of 5%.

The step 106 of forming the second functionalisation layer 13 next preferably comprises a sub-step of fixing, also called grafting, the layer of the second polymer on the guide pattern. This grafting may be carried out by thermal annealing or photo-crosslinking. The thermal annealing may be carried out on a hot plate or in a furnace. The step 106 of forming the second functionalisation layer 13 may next comprise a sub-step of rinsing during which the surplus of the first polymer is removed using a solvent. When the second polymer is PS or PMMA, the solvent used may be propylene glycol methyl ether acetate (PGMEA).

With reference to FIG. 1g, the method next comprises a step 107 of selective etching of the horizontal portion 14 of the second functionalisation layer 13. The etching of the horizontal portion 14 of the second functionalisation layer 13 is anisotropic such that only the horizontal portion 14 of this layer is etched, whereas the vertical portion is conserved. Moreover, the etching of the horizontal portion 14 of the second functionalisation layer 13 is selective such that the protective layer 3, the guide pattern 4, the substrate are not etched during this step. To this end, it is possible to use a reactive ion etching technique, an oxidising or reducing or fluorocarbon (FC) plasma etching technique. The etching is carried out under normal incidence such that the bombarded species arrive perpendicularly to the substrate and thus tangentially to the vertical portions of the second functionalisation layer 13. In order the plasma to be directional, it is highly biased.

With reference to FIG. 1h, the method next comprises a step 108 of etching the horizontal portion 8 of the protective layer 3. This etching is selective such that only the protective layer is etched, and not the functionalisation layers 2, 13, the guide pattern or the substrate. To do this, a wet etching technique may be used. The wet etching may be carried out using a hydrofluoric acid-based or phosphoric acid-based etching solution.

The method thus makes it possible to manufacture a guide pattern provided with a cavity of which the bottom is functionalised with a first functionalisation layer whereas the side walls are functionalised with a second functionalisation layer.

The guide pattern may next be used in a graphoepitaxy method, and notably in a method for the directed self-assembly (DSA) of block copolymers in order to generate patterns of very high resolution and density.

The graphoepitaxy method may then comprise a step of depositing a block copolymer in the cavity of the guide pattern.

This block copolymer could notably be one of the following:
PS-b-PMMA: polystyrene-block-polymethyl methacrylate,
PS-b-PLA: polystyrene-block-polylactic acid,
PS-b-PEO: polystyrene-block-polyethylene oxide,
PS-b-PDMS: polystyrene-block-polydimethylsiloxane,
PS-b-PMMA-b-PEO: polystyrene-block-polymethyl methacrylate-block-polyethylene oxide,
PS-b-P2VP: polystyrene-block-poly(2vinylpyridine).

The block copolymer does not have the same affinities with the first functionalisation layer and with the second functionalisation layer such that the presence of these functionalisation layers makes it possible to control the orientation of the secondary pattern produced by means of the block copolymer in the cavity.

FIGS. 2a to 2i represent the steps of a method according to other embodiments of the invention.

Figure 2A:
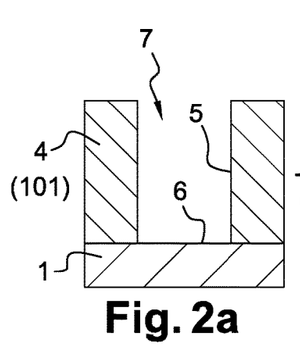
FIGS. 2a to 2i represent the steps of a method according to other embodiments of the invention.

According to this embodiment, and with reference to FIG. 2a, the method comprises a step 101 of forming a guide pattern 4 on the substrate 1 as explained with reference to FIG. 1a.

Figure 2B:
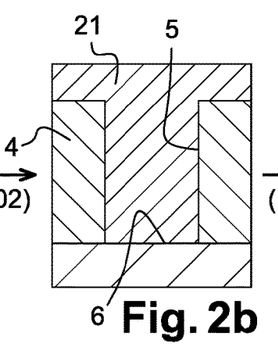
Figure 2C:
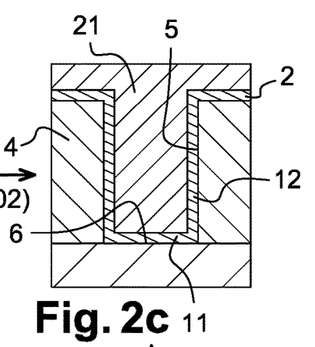
Figure 2D:
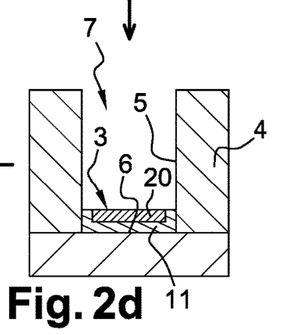

With reference to FIGS. 2b and 2c, the method next comprises a step 102 of forming a first functionalisation layer 2 on the guide pattern 4. This step is identical to that described with reference to FIG. 1b. Thus, with reference to FIG. 2b, the step 102 comprises a sub-step of depositing a layer of the first polymer 21 on the guide pattern 4. With reference to FIG. 2c, the step 102 of forming the first functionalisation layer 2 next comprises a sub-step of fixing, also called grafting, the layer of the first polymer 21 on the guide pattern 4.

In this embodiment, the protective layer 3 is formed by the layer of the first polymer 21 used at step 102 to obtain the first functionalisation layer 2. In this case, instead of totally eliminating the portion of the layer of the first polymer 21 which has not been grafted as described with reference to FIG. 1b, the layer of the first polymer 21 is eliminated only partially so as to leave remaining a horizontal portion 20 of the layer of the first polymer. This horizontal portion of the layer of the first polymer 20 that remains on the first functionalisation layer 2 forms the protective layer 3 after etching. It preferably has a thickness comprised between 10 and 15 nm. The step of partial elimination of the layer of the first polymer so as to only conserve the portion 20 of the layer of the first polymer which forms the protective layer is preferably carried out by plasma etching, potentially preceded by a step of chemical mechanical polishing CMP. This elimination step also makes it possible to remove the vertical portion 12 of the functionalisation layer 2. As an example, if the guide pattern 4 is made of $SiO_2$ or a SOG (spin on glass, for example a siloxane) and if the layer of the first polymer 21 is an organic resin, such as for example PS-r-PMMA, then the plasma used could be a $O_2$-based or $Ar/O_2$ mixture-based plasma.

The method may next comprise steps identical to those described with reference to FIG. 1f to 1h.

Figure 2E:
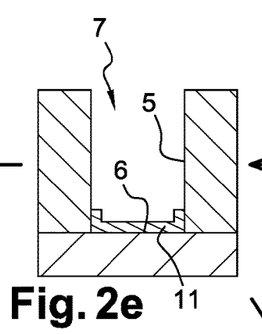
Figure 2F:
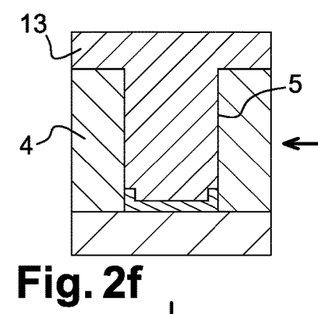
Figure 2G:
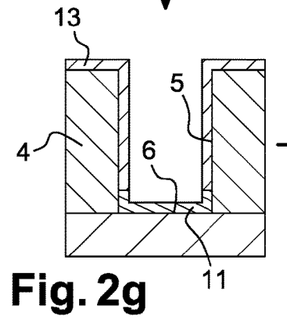

Alternatively, with reference to FIGS. 2e to 2g, the method may comprise one or more of the steps described hereafter.

Thus, with reference to FIG. 2e, it is possible to eliminate the protective layer 3 before the deposition of the second functionalisation layer. In this case the first and second functionalisation layers will be chosen such that the second functionalisation layer does not graft on the first functionalisation layer but uniquely on the side walls 5 of the cavity 7 of the guide pattern 4. To do this, it is possible for example to choose for the first and second functionalisation layers two polymers, such that the polymer forming the second functionalisation layer has a molar mass greater than that of the polymer forming the first functionalisation layer.

With reference to FIGS. 2f and 2g, the method may next comprise a step of forming a second functionalisation layer 13. The second functionalisation layer thus has a molar mass greater than that of the first functionalisation layer. The second functionalisation layer may be deposited by a method analogous to that described with reference to FIG. 1f.

Figure 2H:
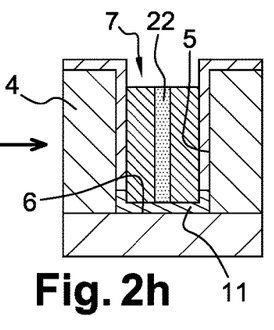

With reference to FIG. 2h, the method may also comprise a step of forming a pattern made of block copolymer 22 in the cavity 7.

Of course, the invention is not limited to the embodiments described with reference to the figures and alternatives could be envisaged without going beyond the scope of the invention. The functionalisation layers could thus have other compositions than those described previously. Similarly, other block copolymers could be used. The invention is not limited either to the solvents given as an example in the detailed description. Furthermore, the invention has been described in the case where the guide pattern comprises a single cavity. However, it is applicable whatever the number of cavities in the guide pattern.

Figure 2I:
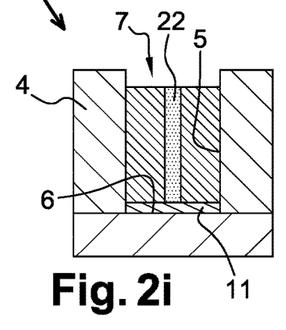

Furthermore, the second functionalisation layer is not necessary, when the side walls of the guide pattern already have the sought-after character (neutral or with the desired affinity with the block copolymer). In this case, the method may comprise a step of forming a pattern made of block copolymer 22 in the cavity 7 directly after the step (FIG. 2e) of forming the horizontal portion of the first functionalisation layer on the bottom of the cavity, as represented in FIG. 2i.

The invention claimed is:
1. A method for the directed self-assembly of a block copolymer by graphoepitaxy, the method comprising:
forming a guide pattern on a substrate, the guide pattern comprising a cavity comprising a bottom and side walls;
forming on the guide pattern a first functionalisation layer made of a first material having a first chemical affinity with respect to the block copolymer, the first functionalisation layer comprising a first portion arranged on the bottom of the cavity and a second portion arranged on the side walls of the cavity;

depositing a protective layer on the first and second portions of the first functionalisation layer such that the protective layer is out of contact with the bottom and the side walls of the cavity of said guide pattern;

etching the protective layer and the second portion of the first functionalisation layer, so as to conserve a portion of the protective layer and to expose the side walls of the cavity, said portion of the protective layer being arranged on the bottom of the cavity and having a thickness below 15 nm;

etching said portion of the protective layer selectively with respect to the first portion of the first functionalisation layer and to the guide pattern; and depositing a block copolymer in the cavity.

2. The method according to claim 1, further comprising, after the etching of said portion of the protective layer, forming a second functionalisation layer on the side walls of the cavity, the second functionalisation layer being formed of a second material having a second chemical affinity with respect to the block copolymer and a molar mass greater than that of the first material.

3. The method according to claim 2, wherein the block copolymer comprises at least two monomer blocks, the first functionalisation layer having an equivalent affinity with all the monomer blocks, the second functionalisation layer having a preferential affinity with one of the monomer blocks.

4. The method according to claim 1, wherein the etching of the protective layer and the second portion of the first functionalisation layer is carried out in two successive sub-steps:

etching the protective layer so as to expose the second portion of the first functionalisation layer and to form said portion of the protective layer;

etching the second portion of the first functionalisation layer selectively with respect to said portion of the protective layer and to the guide pattern.

5. The method according to claim 4, further comprising, before the etching of said portion of the protective layer, the following steps:

forming a second functionalisation layer made of a second material having a second chemical affinity with respect to the block copolymer, the second functionalisation layer comprising a first portion arranged on said portion of the protective layer and a second portion arranged on the side walls of the cavity; and etching the first portion of the second functionalisation layer selectively with respect to the second portion of the second functionalisation layer and to said portion of the protective layer.

6. The method according to claim 5, wherein the first portion of the second functionalisation layer is etched by an anisotropic plasma etching technique.

7. The method according to claim 4, wherein the protective layer is deposited by evaporation.

8. The method according to claim 4, wherein the protective layer is etched by a wet etching technique using a solution of hydrofluoric acid or phosphoric acid.

9. The method according to claim 4, wherein the protective layer is etched by an isotropic plasma etching technique.

10. The method according to claim 4, wherein the second portion of the first functionalisation layer is etched by an isotropic plasma etching technique.

11. The method according to claim 1, wherein said portion of the protective layer is etched by wet etching using a solution of hydrofluoric acid or phosphoric acid.

* * * * *